United States Patent

Iwanabe et al.

(10) Patent No.: US 9,199,539 B2
(45) Date of Patent: Dec. 1, 2015

(54) INSULATED STATE DETECTION DEVICE

(71) Applicant: Yazaki Corporation, Tokyo (JP)

(72) Inventors: Takeshi Iwanabe, Makinohara (JP); Misaki Kimura, Shimada (JP)

(73) Assignee: Yazaki Corporation, Tokyo (JP)

( * ) Notice: Subject to any disclaimer, the term of this patent is extended or adjusted under 35 U.S.C. 154(b) by 190 days.

(21) Appl. No.: 14/167,409

(22) Filed: Jan. 29, 2014

(65) Prior Publication Data

US 2014/0214262 A1    Jul. 31, 2014

(30) Foreign Application Priority Data

Jan. 31, 2013   (JP) ................................. 2013-017217

(51) Int. Cl.
*B60L 3/00* (2006.01)
*G01R 31/02* (2006.01)
*G01R 31/00* (2006.01)

(52) U.S. Cl.
CPC ............... *B60L 3/0069* (2013.01); *G01R 31/02* (2013.01); *G01R 31/025* (2013.01); *G01R 31/007* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,761,799 A | * | 9/1973 | Shuey | G05F 1/595 323/270 |
| 3,781,637 A | * | 12/1973 | Potter | H02M 7/517 323/908 |
| 5,113,840 A | * | 5/1992 | Taruya | F02P 3/0435 123/609 |
| 5,465,190 A | * | 11/1995 | Meunier | H02H 3/025 361/111 |
| 6,225,826 B1 | * | 5/2001 | Krishnamurthy | H03K 19/096 326/83 |
| 6,437,648 B1 | * | 8/2002 | Van Beylen | H03F 3/3074 330/297 |
| 6,639,409 B2 | * | 10/2003 | Morimoto | G01R 31/3658 324/434 |
| 6,803,766 B2 | * | 10/2004 | Kobayashi | G01R 31/3658 320/116 |
| 6,813,170 B2 | * | 11/2004 | Yang | H02M 1/32 323/901 |
| 7,315,461 B2 | * | 1/2008 | Kyono | H02M 1/32 323/907 |
| 7,602,144 B2 | * | 10/2009 | Seo | B60L 3/0046 320/116 |
| 8,232,806 B2 | * | 7/2012 | Kawamura | B60L 3/0023 324/503 |
| 8,368,406 B2 | * | 2/2013 | Kawamura | G01R 27/025 324/503 |
| 9,000,772 B2 | * | 4/2015 | Kawamura | G01R 31/021 324/509 |
| 9,018,959 B2 | * | 4/2015 | Kawamura | G01R 31/025 324/509 |
| 2008/0079416 A1 | | 4/2008 | Kawamura | |
| 2008/0310063 A1 | | 12/2008 | Kawamura et al. | |

FOREIGN PATENT DOCUMENTS

| | | |
|---|---|---|
| JP | 2004-170146 A | 6/2004 |
| JP | 2008-89323 A | 4/2008 |
| JP | 2008-309751 A | 12/2008 |

* cited by examiner

*Primary Examiner* — Rami Khatib
(74) *Attorney, Agent, or Firm* — Sughrue Mion, PLLC

(57) ABSTRACT

An insulated state detection device includes a positive-side input terminal, a negative-side input terminal, a ground electrode, a ground fault resistance value calculation unit, a measuring state identification unit, a timing information generation unit that generates a timing information, automatically updates a value of the timing information by a predetermined value each time the ground fault resistance value calculation unit generates a new insulation resistance value, and reflects a state of the identification of the measuring state identification unit on the value of the timing information, and an information transmission unit that transmits the insulation resistance value calculated by the ground fault resistance value calculation unit and the timing information generated by the timing information generation unit to a host control device.

7 Claims, 9 Drawing Sheets

INSULATED STATE DETECTION DEVICE

CROSS REFERENCE TO RELATED APPLICATION

This application is based on Japanese Patent Application No. 2013-017217 filed on Jan. 31, 2013, the contents of which are incorporated herein by reference.

BACKGROUND OF THE INVENTION

1. Technical Field

The present invention relates to an insulated state detection device which is usable in a state of being mounted on a vehicle.

2. Background Art

For example, in a vehicle using electric power as propulsion energy, such as an electric vehicle, a DC power supply device that outputs a high voltage of about 200 V may be mounted. The vehicle equipped with such a high-voltage DC power supply device is used in a state where positive and negative power lines of the DC power supply device and a vehicle body are electrically insulated from each other. In other words, the vehicle body is not used as an earth of a power supply that outputs a high voltage.

In such a vehicle, there is a need to check and confirm that wirings of the output of a high-voltage DC power supply and the vehicle body are well electrically insulated from each other in order to secure safety or the like. Conventional insulated state detection devices used in performing such a checking are disclosed in JP-A-2004-170146, JP-A-2008-089323 and JP-A-2008-309751 for example.

Such an insulated state detection device uses a flying capacitor. A detection capacitor (referred to as "flying capacitor") is connected, only for a certain period of time, between high-voltage positive and negative power lines and a ground electrode (vehicle body) via a switching element. A ground fault resistance, i.e., an insulation resistance between the power lines and the ground electrode is calculated by monitoring the charging voltage of the flying capacitor and performing calculation based on the charging voltage.

Further, JP-A-2004-170146 and JP-A-2008-089323 disclose a technique related to fault detection of a switch for switching the flying capacitor.

Further, JP-A-2008-309751 discloses a technique for protecting a circuit in such a way that a high voltage greater than a predetermined level is not applied to a circuit for detecting a voltage of the flying capacitor.

However, in a vehicle equipped with a DC power supply device that outputs a high voltage, it may be desirable to check, not only at shipment of a vehicle or periodic inspection but also frequently on a daily basis, that wirings of the output of a high-voltage DC power supply and a vehicle body are well electrically insulated from each other.

In such a case, it is necessary to equip the insulated state detection device on a vehicle as a sensor, as described above. When a vehicle is equipped with the insulated state detection device as a sensor, it is possible to identify the presence or absence of the occurrence of abnormality by regularly measuring a ground fault resistance (insulation resistance), e.g. during use of the vehicle using the insulated state detection device.

Actually, it is necessary that the insulated state detection device measures voltage of the flying capacitor while controlling ON/Off of each switching element in accordance with a predetermined schedule and calculates the ground fault resistance based on the measured voltage and a calculation formula. Further, in order to identify the presence or absence of a failure of each of switching elements incorporated in the insulated state detection device or to improve reliability of the measured ground fault resistance value, a control of stopping measurement at the timing that is not suitable for the measurement is also required. Such a complicated control is executed by a control circuit such as a microcomputer incorporated in the insulated state detection device.

Meanwhile, an actual vehicle is equipped with various electronic control units (ECU) in order to make a predetermined diagnosis on the function of each pail of the vehicle and to display the diagnosis result or to reflect the diagnosis result to other controls. Accordingly when the insulated state detection device is equipped on a vehicle as a sensor, the insulated state detection device is connected under the electronic control unit (ECU) that comes standard with a vehicle side. In that case, a host electronic control unit (ECU) acquires a ground fault resistance value (that is a measurement result), as necessary, from the ECU-affiliated insulated state detection device through communication and outputs the final diagnosis result by making a diagnosis of such information.

Meanwhile, in an actual vehicle, there is a possibility that an environment in which the insulated state detection device measures the ground fault resistance changes in various ways. For example, the ground fault resistance to be detected also changes when power supply voltage changes in accordance with charge/discharge of a vehicle battery. Further, a possibility is considered that tire ground fault resistance is temporarily decreased when each of on-vehicle devices is operated, for example. Further, a possibility is also considered that the ground fault resistance temporarily changes with the changes in the weather (such as rainfall, for example) or changes in temperature or humidity, etc.

Since the electronic control unit (ECU) that comes standard with a vehicle is able to make a final diagnosis, based on various information that can be acquired on the vehicle, it is possible to output a reliable diagnosis result for the ground fault resistance.

However, despite the fact that the insulated state detection device as described above performs measurement and calculation at independent timing that is established by its own, the host electronic control unit (ECU) can receive only the data of ground fault resistance of the measurement results.

For example, in a case where the insulated state detection device measures the grounding and then recognizes that the situation is nest suitable for measurement, there is a possibility that the insulated state detection device stops measuring and transmits data of ground fault resistance measured in the last to the host electronic control unit. Accordingly, the host electronic control unit cannot discriminate whether the data of ground fault resistance received from the ECU-affiliated insulated state detection device is the latest measurement data or an old measurement data. Specifically, the host electronic control unit cannot grasp whether or not the data of ground fault, resistance received from the ECU-affiliated insulated state detection device is a data of ground fault resistance measured at timing that is intended by its own (the electronic control device) when making a diagnosis on the data of ground fault resistance received from the ECU-affiliated insulated state detection device. Accordingly, there is a possibility that error in diagnosis occurs. For example, despite the fact that the data received from the insulated state detection device is an old data measured at timing in which the host electronic control unit considers the measurement to be invalid, there is a possibility that the data received from the insulated state detection device is considered as the reliable latest data and therefore a diagnosis is made.

Accordingly, it is considered that information representing the time in which the ground fault resistance is measured, for example, is transmitted from the insulated state detection device to the host electronic control unit. However, in order to handle information of time (hours, minutes, seconds, etc.), the number of bits more than that of the ground fault resistance is required and therefore waste is increased. Furthermore, it is not possible to grasp the correct time, unless the time of the insulated state detection device side and the time of the host electronic control device side are synchronized with each other in some ways.

The present invention has been made in consideration of the above situations and an object thereof is to provide an insulated state detection device capable of transmitting information that is helpful to allow a host electronic control unit performing a final diagnosis to grasp actual measurement timing of a ground fault resistance data.

SUMMARY OF THE INVENTION

In order to achieve the above-described objects, the insulated state detection device according to the present invention is characterized in the following (1) to (7).

(1) According to an aspect of the invention, an insulated state detection device includes a positive-side input terminal and a negative-side input terminal that are respectively connected to a positive-side power line and a negative-side power line of an output of a predetermined high-voltage DC power supply, a ground electrode, a ground fault resistance value calculation unit that calculates an insulation resistance value between the ground electrode and the positive-side power line and between the ground electrode and the negative-side power line based on measured values related to a charging voltage of a flying capacitor, a measuring state identification unit that identifies presence or absence of abnormality on at least one measurement condition affecting the measured values, a timing information generation unit that generates a timing information, automatically updates a value of the timing information by a predetermined value each time the ground fault resistance value calculation unit generates a new insulation resistance value, and reflects a state of the identification of the measuring state identification unit on the value of the timing information, and an information transmission unit that transmits the insulation resistance value calculated by the ground fault resistance value calculation unit and the timing information generated by the timing information generation unit to a host control device.

(2) In the insulated state detection device described in the above (1), the measuring state identification unit initializes the value of the timing information generated by the timing information generation unit when a predetermined measurement disabled state is detected or when the measurement disabled state is released, and the ground fault resistance value calculation unit stops calculating a new insulation resistance value in the measurement disabled state.

(3) In the insulated state detection device described in the above (1), the measuring state identification unit stops updating the value of the timing information generated by the timing information generation unit and maintains the same value when a predetermined measuring abnormal state is detected, and the ground fault resistance value calculation unit stops calculating a new insulation resistance value in the measuring abnormal state.

(4) In the insulated state detection device described in the above (1), the measuring state identification unit stops updating the value of the timing information generated by the timing information generation unit when a temporary measuring abnormal state is detected and maintains the timing information at the same value until returning to a normal state, and the ground fault, resistance value calculation unit stops calculating a new insulation resistance value until returning to a normal state after the temporary measuring abnormal state is detected.

(5) In the insulated state detection device described in the above (1), the measuring state identification unit initializes the value of the timing information generated by the timing information generation unit when a reset state by an ignition signal transmitted from a vehicle is detected.

(6) In the insulated state detection device described in the above (1), the information transmission unit transmits the information of the insulation resistance value calculated in the last together with the timing information each time a predetermined time elapses in a state where the ground fault resistance value calculation unit stops calculating a new insulation resistance value.

(7) In the insulated state detection device described in the above (1), the measuring state identification unit detects abnormality of power supply voltage applied to at least the positive-side power line or the negative-side power line, on the basis of the measured value of voltage of the flying capacitor in a predetermined condition.

According to the insulated state detection device having the configuration of the above (1), the host control device can receive the insulation resistance value and the timing information generated by the timing information generation unit. Further, since the identification state of the measuring state identification unit is reflected on the timing information in accordance with condition changes, the host control device can associate and synchronize the timing grasped by the host control device itself with the value of the timing information. Further, since the value of the timing information is updated each time the ground fault resistance value calculation unit calculates a new insulation resistance value, it is possible to minimize the number of bits of the timing information.

According to the insulated state detection device having the configuration of the above (2), the host control device is able to find that the insulation resistance value measured in what timing from the start or restart of the measurement operation is obtained by the value of the timing information received.

According to the insulated state detection device having the configuration of the above (3), the timing information does not change but remains as the same value when the measurement is stopped in a predetermined measuring abnormal state. Accordingly, the host control device is able to grasp that the measurement operation is stopped and the insulation resistance value is not updated but remains as an old data by the value of the timing information received.

According to the insulated state detection device having the configuration of the above (4), the timing information does not change but remains as the same value when the measurement operation is on standby until returning to the normal state from the temporary measuring abnormal state. Accordingly, the host control device is able to grasp that the measurement operation is stopped and the insulation resistance value is not updated but remains as an old data by the value of the timing information received.

According to the insulated state detection device having the configuration of the above (5), it is possible to determine the value of the timing information by adopting when ignition of a vehicle is turned on as reference timing. Since the host control device can also monitor the ignition signal, the host control device can synchronize the timing grasped by the host control device itself with the measurement timing of the insulated state detection device by the ignition signal.

According to the insulated state detection device having the configuration of the above (6), it is possible to always transmit the information of the insulation resistance value measured in the last when abnormality does not occur. Further, since the host control device can regularly receive information from the insulated state detection device, the host control device is able to grasp that the insulated state detection device is being operated.

According to the insulated state detection device having the configuration of the above (7), when an abnormality occurs in the power supply voltage, it is possible to detect the abnormality of the power supply voltage and to stop the measurement. Accordingly, it is possible to prevent information of the insulation resistance value with poor reliability from being transmitted.

According to the insulated state detection device of the present invention, it is possible to transmit information that is helpful to allow a host electronic control unit performing a final diagnosis to grasp actual measurement timing of a ground fault resistance data.

Hereinabove, the present invention has been described in brief. Further, details of the present invention will be more apparent by thoroughly reading a form (hereinafter, referred to as an "embodiment") for carrying out the invention described below with reference to the accompanying drawings.

DESCRIPTION OF PREFERRED EMBODIMENT

Hereinafter, specific illustrative embodiments of an insulated state defection device of the present invention will be described with reference to respective drawings.

Configuration Example of System

Entire Configuration and Overview of Operation

Figure 1:
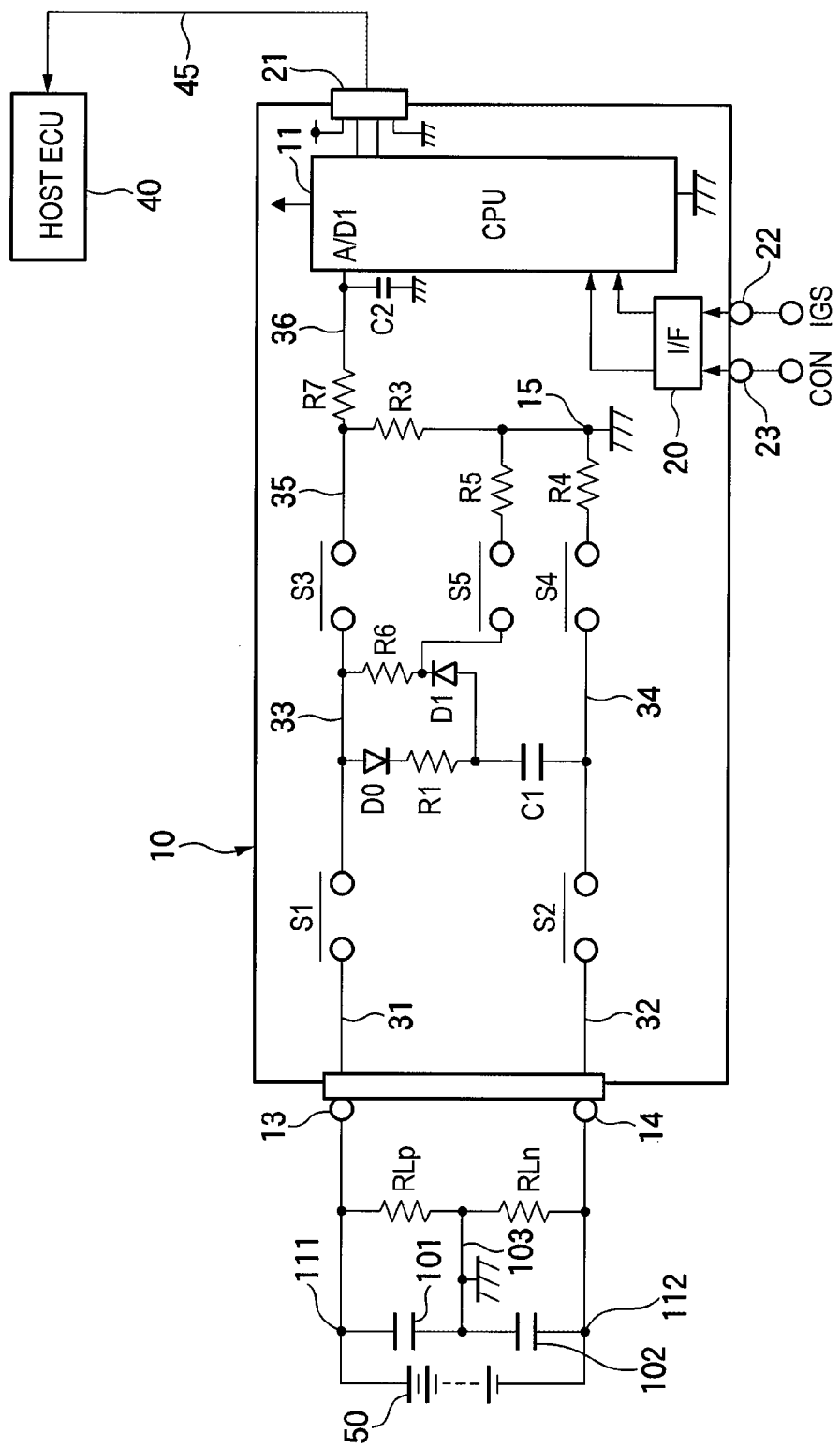
FIG. 1 is an electric circuit diagram showing a configuration of an insulated state detection device mounted on a vehicle and peripheral circuits thereof.

FIG. 1 shows a configuration of an insulated state detection device 10 mounted on a vehicle and peripheral circuits thereof. A system shown in FIG. 1 is mounted on a vehicle such as electric vehicles or hybrid vehicles including an engine and an electric motor as a driving source, for example.

An in-vehicle DC high-voltage power supply 50 outputs a high-voltage DC power of about 200 V, for example. The power outputted from the in-vehicle DC high-voltage power supply 50 can drive an electric motor that generates a propulsive force for a vehicle.

A ground electrode 103 and a positive-side power line 111 of the output of the in-vehicle DC high-voltage power supply 50 are electrically insulated from each other. Further, the ground electrode 103 and a negative-side power line 112 of the output of the in-vehicle DC high-voltage power supply 50 are electrically insulated from each other. The ground electrode 103 corresponds to an earth part such as a vehicle body of a vehicle. Here, an insulation state between the ground electrode 103 and the positive-side power line 111 is represented as a ground fault resistance RLp. Further, an insulation state between the ground electrode 103 and the negative-side power line 112 is represented as a ground fault resistance RLn.

Further, in order to reduce common-mode noise, a Y capacitor 101 is connected between the ground electrode 103 and the positive-side power line 111 and a Y capacitor 102 is connected between the ground electrode 103 and the negative-side power line 112, as shown in FIG. 1.

In the present embodiment, the insulated state detection device 10 is equipped on a vehicle as a sensor in order to monitor an insulated state of the vehicle at any time, if necessary. In other words, the insulated state detection device 10 is used to detect the ground fault resistances RLp, RLn in the output of the in-vehicle DC high-voltage power supply 50 and grasp the insulated state.

Accordingly, as shown in FIG. 1, a positive-side input terminal 13 and a negative-side input terminal 14 of the insulated state detection device 10 is respectively connected to the positive-side power line 111 and the negative-side power line 112. Further, a ground electrode 15 of the insulated state detection device 10 is connected to the ground electrode 103.

The insulated state detection device 10 itself may identify the presence or absence of abnormality on the ground fault resistance, based on the measurement results of the ground fault resistance. However, in the present embodiment, a host ECU (electronic control unit) 40 performs a final determination on the presence or absence of abnormality of the ground fault resistance, based on various information and conditions of a vehicle.

Accordingly, the output of an output connector 21 of the insulated state detection device 10 is connected to the host ECU 40 via an on-vehicle communication line 45 in order to allow data communication between the insulated state detection device 10 and the host ECU 40.

As will be described later, the insulated state detection device 10 can regularly transmit information of a ground fault resistance value as a measurement result to the host ECU 40. Further, the insulated state detection device 10 can transmit a ground fault information ID together with the ground fault resistance value. Here, the ground fault information ID represents the measurement timing of a corresponding ground fault resistance value. Furthermore, the insulated state detection device 10 can also transmit various status information representing the state of its own to the host ECU 40.

Configuration Example of Insulated State Detection Device 10

As shown in FIG. 1, a detection capacitor C1 operating as a flying capacitor is provided on the circuit of the insulated state detection device 10. Further, five switching elements S1 to S5 are provided in the periphery of the detection capacitor C1 in order to control the charge and discharge of the detection capacitor C1. Each of the switching elements S1 to S5 is a switch (such as a photo MOSFET, for example) that is capable of switching an opening/closing (ON/OFF) state of a contact under the control of insulated signal.

The switching element S1 has one end connected to the positive-side input terminal 13 via a wiring 31 and the other end connected to a wiring 33. The switching element S2 has one end connected to the negative-side input terminal 14 via a wiring 32 and the other end connected to a wiring 34.

The switching element S3 has one end connected to the wiring 33 and the other end connected to a wiring 35. The switching element S4 has one end connected to the wiring 34 and the other end connected to the ground electrode 15 via a resistor R4.

A negative-side terminal of the detection capacitor C1 is connected to the wiring 34. A positive-side terminal of the detection capacitor C1 is connected to the wiring 33 via a series circuit that is configured by a diode D0 and a resistor R1. Further, the positive-side terminal of the detection capacitor C1 is connected to the wiring 33 via a series circuit that is configured by a diode D1 and a resistor R6.

The switching element S5 has one end connected to a cathode of the diode D1 and the other end connected to the ground electrode 15 via a resistor R5. The wiring 35 is connected to the ground electrode 15 via a resistor R3.

A microcomputer (CPU) 11 executes various controls required for the insulated state detection device 10 by executing a program installed in advance. Specifically, the microcomputer (CPU) 11 controls the charge and discharge of the detection capacitor C1 by individually controlling the switching elements S1 to S5. Further, the microcomputer (CPU) 11 inputs an analog level corresponding to the charging voltage of the detection capacitor C1 via a wiring 36 and performs the calculation based on the input level, thereby grasping the ground fault resistances RLp and RLn.

Ignition signal IGS and external control signal CON are respectively applied to input terminals 22, 23 of the insulated state detection device 10. The ignition signal IGS is an electric signal that represents an ON/OFF state of an ignition switch of a vehicle. The external control signal CON can be used when other devices control the insulated state detection device 10 as necessary. The ignition signal IGS and the external control signal CON are applied to an input port of the microcomputer 11 via an input circuit (I/F) 20.

The microcomputer 11 has a built-in serial communication interface. A signal line of the microcomputer 11 used in the serial communication is to the output connector 21. Accordingly, the microcomputer 11 can execute data communication with the host ECU 40.

Measurement of Ground Fault Resistance

Explanation for Charge/Discharge of Detection Capacitor (Flying Capacitor) C1

Switching Timing

Figure 8:
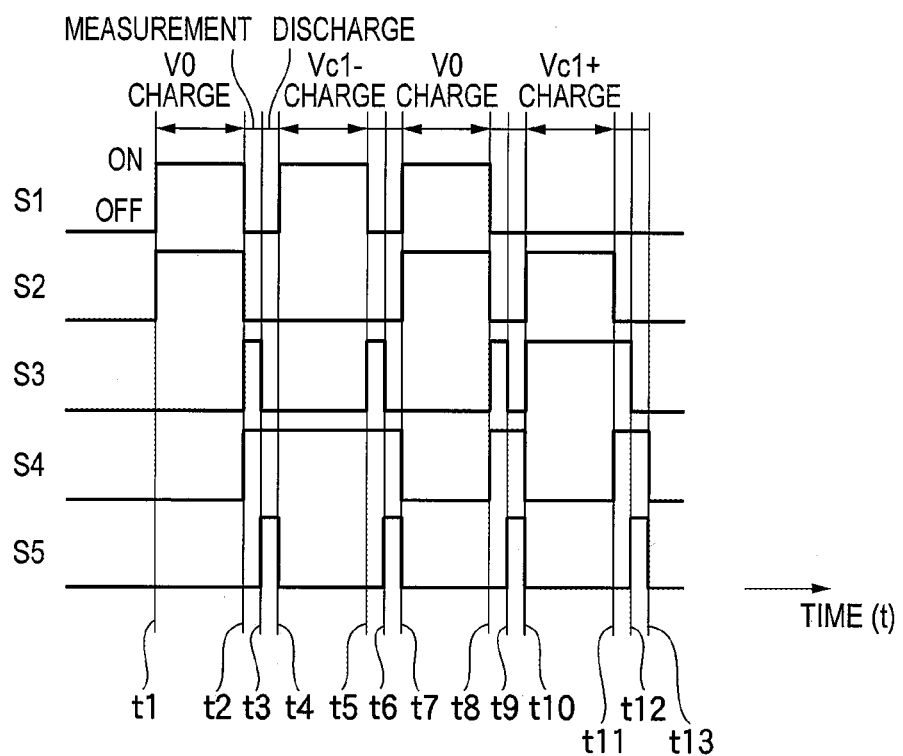
FIG. 8 is a time chart showing a specific example of charge/discharge control timing of a flying capacitor in the insulated state detection device shown in FIG. 1.

FIG. 8 shows a specific example of switching timing of the switching elements S1 to S5 during measurement. In other words, when performing the measurement of the ground fault resistances RLp and RLn, the microcomputer 11 controls ON/OFF of the switching elements S1 to S5 according to a schedule of a basic measurement cycle shown in FIG. 8 and acquires measurement values required for the calculation of the ground fault resistances.

The basic measurement cycle shown in FIG. 8 is composed of a sequence of the sections of "V0 charge", "measurement", "discharge", "Vc1−charge", "measurement", "discharge", "V0 charge", "measurement", "discharge", "Vc1+charge", "measurement" and "discharge".

In the "V0 charge" section at time t1 to t2, the switching elements S1 and S2 are turned on (contact is closed) and the other switching elements are turned off (contact is opened). In the "measurement" section at time t2 to t3, the switching elements S3 and S4 are turned on and the other switching elements are turned off.

In the "discharge" section at time t3 to t4, the switching elements S4 and S5 are turned on and the other switching elements are turned off. In the "Vc1−charge" section at time t4 to t5, the switching elements S1 and S4 are turned on and the other switching elements are turned off.

The "measurement" section at time t5 to t6 is the same as the "measurement" section at time t2 to t3. Further, the "discharge" section at time t6 to t7 is the same as the "discharge" section at time t3 to t4. The "V0 charge" section at time t7 to t8 is the same as the "V0 charge" section at time t1 to t2. The "measurement" section at time t8 to t9 that follows is the same as the "measurement" section at time t2 to t3. Further, the "discharge" section at time t9 to t10 is the same as the "discharge" section at time t3 to t4.

In the "Vc1+charge" section at time t10 to t11, the switching elements S2 and S3 are turned on and the other switching elements are turned off. The "measurement" section at time t11 to t12 is the same as the "measurement" section at time t2 to t3. Further, the "discharge" section at time t12 to t13 is the same as the "discharge" section at time t3 to t4.

Energization Path and Operation in Each Section of Measurement Cycle

"V0 Charge" Section:

Since the contact of the switching element S1 is closed, current flows from the positive-side power line 111 to the positive-side terminal of the detection capacitor C1 through the positive-side input terminal 13, the wiring 31, the switching element S1, the diode D0 and the resistor R1. Further, since the contact of the switching element S2 is closed, current flows from the negative-side terminal of the detection capacitor C1 to the negative-side power line 112 through the wiring 34, the switching element S2, the wiring 32 and the negative-side input terminal 14. Accordingly, electric charges are charged to the detection capacitor C1 by the current.

"Measurement" Section:

Since the contact of the switching element S4 is closed, the negative-side terminal of the detection capacitor C1 is connected to the ground electrode 15 via the resistor R4. Further, since the contact of the switching element S3 is closed, the positive-side terminal of the detection capacitor C1 is connected to an analog input port of the microcomputer 11 via the diode D1, the resistor R6, the switching element S3, the wiring 35, the input circuit 20 and the wiring 36. Accordingly, the microcomputer 11 can detect an analog level proportional to the charging voltage of the detection capacitor C1.

"Discharge" Section:

Since the contact of the switching element S4 is closed, the negative-side terminal of the detection capacitor C1 is connected to the ground electrode 15 via the resistor R4. Further, since the contact of the switching element S5 is closed, the positive-side terminal of the detection capacitor C1 is connected to the ground electrode 15 via the diode D1, the switching element S5 and the resistor R5. Accordingly, the electric charge accumulated in the detection capacitor C1 is discharged.

"Vc1−Charge" Section:

Since the contact of the switching element S1 is closed, current flows from the positive-side power line 111 to the positive-side terminal of the detection capacitor C1 through the positive-side input terminal 13, the wiring 31, the switching element S1, the diode DCs and the resistor R1. Further, since the contact of the switching element S4 is closed, current flows from the negative-side terminal of the detection capacitor C1 to the negative-side power line 112 through the switching element S4, the resistor R4, the ground electrode 15, the ground electrode 130 and the ground fault resistance RLn. Electric charges are charged to the detection capacitor C1 by the current. The charging voltage at this time is a result that reflects the influence of the ground fault resistance RLn.

"Vc1+Charge" Section:

Since the contact of the switching element S3 is closed, current flows from the positive-side power line 111 to the positive-side terminal of the detection capacitor C1 through the ground fault resistance RLp, the ground electrode 103, the ground electrode 15, the resistor R3, the switching element S3, the diode D0 and the resistor R1. Further, since the contact of the switching element S2 is closed, current flows from the negative-side terminal of the detection capacitor C1 to the negative-side power line 112 through the wiring 34, the switching element S2, the wiring 32 and the negative-side input terminal 14. Electric charges are charged to the detection capacitor C1 by the current. The charging voltage at this time is a result that reflects the influence of the ground fault resistance RLp.

Measuring Operation of Basic Ground fault Resistance

For an operation of the insulated state detection device 10 shown in FIG. 1, the following relationship is basically established.

$$(RLp+RLn)/(RLp \times RLn) = \{(Vc1+)+(Vc1-)\}/Vc1$$

Here,

Vc1: Charging voltage of the detection capacitor C1 according to the output voltage of the in-vehicle DC high-voltage power supply 50

Vc1−: Charging voltage of the detection capacitor C1 affected by a negative-side ground fault resistance RLn Vc1+: Charging voltage of the detection capacitor C1 affected by a positive-side ground fault resistance RLp RLp, RLn: Resistance value of each ground fault resistance Accordingly, the microcomputer 11 can grasp each of the charging voltage "Vc1", "Vc1−" and "Vc1+" from a signal level inputted to an analog input port (A/D1) in each state and calculate the ground fault resistances RLp, RLn based on the above-described relationship.

Specific Example of Events affecting Measurement of Ground Fault Resistance (1) For example, in situations such as the case where the power supply voltage outputted from the in-vehicle DC high-voltage power supply 50 is abnormally high, the case where the power supply voltage is abnormally low or the case where variation in the power supply voltage is large, the environment for measuring the ground fault resistance is different from the normal. Accordingly there is a possibility that a reliable ground fault resistance value cannot be obtained. For example, it is considered that such a situation occurs in a case where the in-vehicle DC high-voltage power supply 50 is charged from the outside of a vehicle, a case where a large load is temporarily applied or a case where a special device is operated, etc.

(2) Since abnormality is caused in the measured value when a failure or abnormal operation occurs in the insulated state defection device 10, it is not possible to detect a correct ground fault resistance. For example, in the case of a failure of devices such as the switching elements S1 to S5, a failure of the A/D conversion function of the microcomputer 11, an abnormal operation of the microcomputer 11 and deterioration of the detection capacitor C1, etc., it is not possible to obtain a reliable ground fault resistance.

(3) Further, a possibility is considered that the ground fault resistance is temporarily decreased when each of on-vehicle devices is operated, for example. Further, a possibility is also considered that the ground fault resistance temporarily changes with the changes in the weather (such as rainfall, for example) or changes in temperature or humidity, etc.

Control for Improving Reliability of Diagnosis of Ground Fault Resistance

The insulated state detection device 10 itself can grasp a failure and deterioration of its own or detect abnormality of the voltage outputted from the in-vehicle DC high-voltage power supply 50. Accordingly, at that time, it is possible to stop the measurement of the ground fault resistance or to inform the outside of the occurrence of abnormality.

Meanwhile, the host ECU 40 performs a final diagnosis on the presence or absence of abnormality of the ground fault resistance using the information of the ground fault resistance received from the insulated state detection device 10. Since the host ECU 40 can grasp various conditions of a vehicle, in addition to the information that can be obtained by the insulated state detection device 10, it is possible to make a diagnosis of the ground fault resistance with high accuracy.

However, since each of the host ECU 40 and the insulated state detection device 10 is operated in independent timing, there is a possibility that problems occur in the diagnosis of the ground fault resistance. For example, even when an old data of ground fault resistance that is measured in the past is being transmitted in a state where the insulated state detection device 10 stops measuring the ground fault resistance, there is a possibility that the host ECU 40 mistakes the received data for the latest data of ground fault resistance. For this reason, reliability of diagnosis is reduced when actual measurement timing is deviated from the measurement timing that is grasped by the host ECU 40.

Accordingly, as will be described later, the insulated state detection device 10 shown in FIG. 1 transmits a ground fault information ID (representing the actual measurement timing) together with the data of ground fault resistance to the host ECU 40. As a result, the host ECU 40 can grasp the actual measurement timing of the ground fault resistance and therefore it is possible to improve the reliability of diagnosis.

Control Operation in Insulated State Detection Device 10

Processing Content of Microcomputer 11

Figure 2:
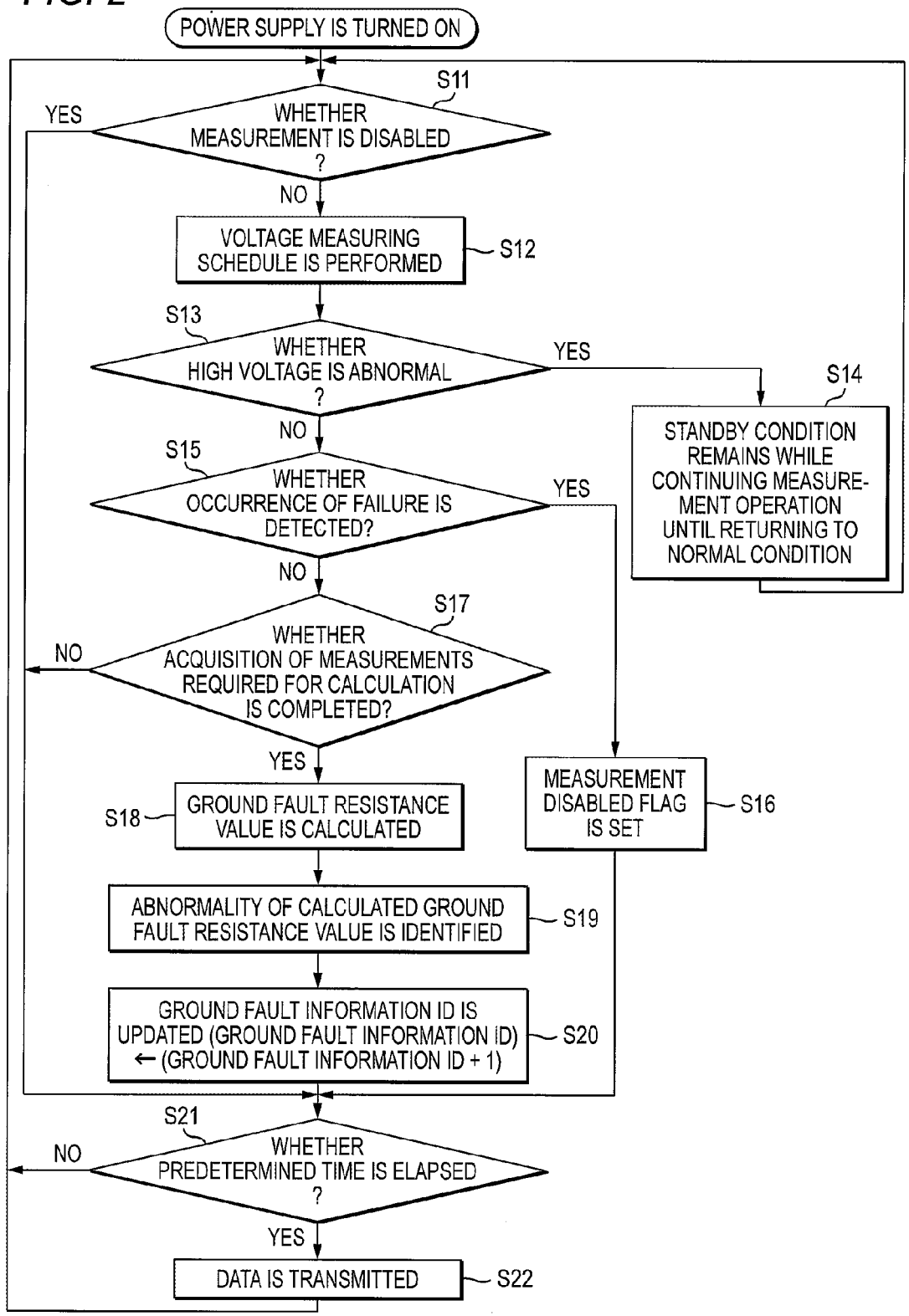
FIG. 2 is a flow chart showing a main flow for control operation of the insulated state detection device shown in FIG. 1.
Figure 3:
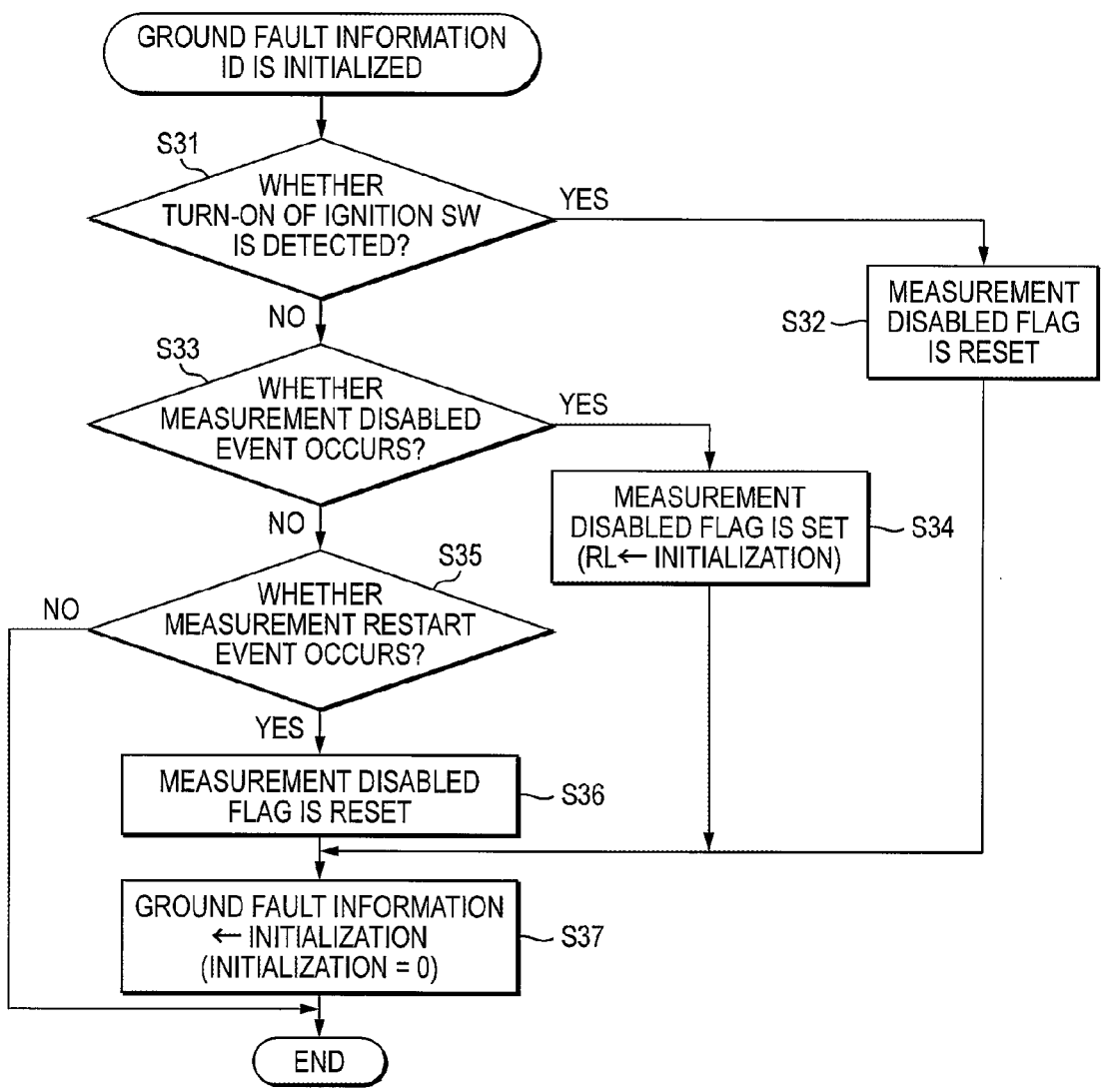
FIG. 3 is a flow chart showing a ground fault information ID initialization process in the insulated state detection device shown in FIG. 1.

FIG. 2 shows a main flow for control operation of the insulated state detection device shown in FIG. 1. Further, FIG. 3 shows a ground fault information ID initialization process in the insulated state detection device shown in FIG. 1. In other words, the microcomputer 11 executes the process shown in FIG. 2 and FIG. 3. Further, the process shown in FIG. 3 is performed repeatedly at regular time intervals.

When power of the insulated state detection device 10 is turned on, the microcomputer 11 executes a predetermined initialization process and then starts to execute the process from Step S11 FIG. 2. In Step S11, the microcomputer 11 identifies whether or not measurement is disabled by referring to the state of "measurement disabled flag" assigned to an internal memory. When it is identified that the measurement is not disabled, the process proceeds to next Step S12. Further, when it is identified that the measurement is disabled, the process proceeds to Step S21.

In Step S12, the microcomputer 11 executes a voltage measuring schedule, in other words, the microcomputer 11 measures voltage (V0, Vc1−, Vc1+) of the detection capacitor C1 while controlling each of the switching elements S1 to S5 at the timing shown in FIG. 8.

In Step S13, the microcomputer 11 identifies the presence or absence of abnormality on the power supply voltage (high voltage) outputted from the in-vehicle DC high-voltage power supply 50. Specifically, the microcomputer 11 identifies the presence or absence of abnormality by comparing the voltage V0 measured in Step S12 with a predetermined threshold. When it is identified that abnormality of the high voltage is present, the process proceeds to Step S14. Further, when it is identified that abnormality of the high voltage is absent, the process proceeds to Step S15.

In Step S14, the microcomputer 11 is on standby while continuing the measuring operation in Step S12 until the high voltage returns to the normal.

In Step S15, the microcomputer 11 identifies the presence or absence of a failure or deterioration in the insulated state detection device 10. Actually, the microcomputer can detect a failure of the switching elements S1 to S5 or the like, deterioration of the detection capacitor C1, etc., by comparing the voltage measured at each of timing when executing Step S12 with a predetermined threshold. When the failure is detected, the process proceeds to Step S16. When the failure is not detected, the process proceeds to Step S17.

In Step S16, the microcomputer 11 sets a "measurement disabled flag" in order to switch the measurement state into the measurement disabled state and the process proceeds to Step S21.

In Step S17, the microcomputer 11 identifies whether acquisition of all measured values (V0, Vc1−, Vc1+) required for the calculation of the ground fault resistance is completed or not. When it is detected that the acquisition is completed, the process proceeds to Step S18. When if is detected that the acquisition is not completed, the process proceeds to Step S21.

In Step S18, the microcomputer 11 calculates a ground fault resistance value by substituting the latest measured values (V0, Vc1−, Vc1+) acquired in a predetermined calculation formula.

In Step S19, the microcomputer 11 identifies the presence or absence of abnormality of the ground fault resistance by comparing the ground fault resistance value calculated in Step S18 with a predetermined threshold.

In Step S19, the microcomputer 11 updates the value of "ground fault information ID" representing the measurement timing of the ground fault resistance. In either words, the result obtained by adding "+1" to the value of "ground fault information ID" before updating is set as the value of "ground fault information ID" after updating. In the present embodiment, a 7-bit memory is assigned in order to represent the "ground fault information ID". Accordingly, the "ground fault information ID" can be represented by the value ranging from 0 to 127 in decimal number. When Step S20 is performed in a state where the value of the "ground fault information ID" is 127, the value of the "ground fault information ID" is updated and returns to "0". Further, the value of the "ground fault information ID" changes in a manner of 1, 2, 3, 4, . . . each time Step S20 is performed.

In Step S21, the microcomputer 11 identifies whether a certain period of time defined in advance has elapsed or not. When it is identified that the certain period of time has elapsed, the process proceeds to Step S22. In the other timing, the process returns to Step S11. One second can be defined as a specific example of the certain period of time. In other words, the next Step S22 is regularly performed each time one second has elapsed.

In Step S22, the microcomputer 11 performs a data communication with the host ECU 40 using a built-in serial communication interface. Here, the data to be transmitted includes the ground fault resistance value calculated in the last in Step S18, the "ground fault information ID" updated in the last in Step S20 and the status information. As the status information, the presence or absence of abnormality of the high voltage defected in Step S13, information on the failure occurrence of each part detected in Step S15 or information on the "measurement disabled flag", etc., can be included.

Meanwhile, in Step S31 of FIG. 3 that is regularly performed, the microcomputer 11 identifies whether or not immediately after an ignition switch is switched from an OFF state to an ON state by referring to the ignition signal IGS. When if is identified that the ignition switch is switched to the ON state, the process proceeds to S32. In the other timing, the process proceeds to Step S33.

In Step S32, the microcomputer 11 resets the "measurement disabled flag" described above in order to release the measurement disabled state and then the process proceeds to Step S37.

In Step S33, the microcomputer 11 identifies whether a predetermined "measurement disabled event" occurs or not. Immediately after it is identified that the predetermined "measurement disabled event" occurs, the process proceeds to Step S34. In the other timing, the process proceeds to Step S35.

Actually, the microcomputer 11 considers that the "measurement disabled event" occurs when any one of the following conditions is satisfied, for example.

(1) When a state of the insulated state detection device 10 that is grasped by the microcomputer 11 is in a situation corresponding to the "measurement disabled event".

(2) When "measurement disabled" instruction is received from the outside by the switching of the state of the external control signal CON.

(3) When the microcomputer 11 receives a "measurement disabled" command from the host ECU 40 through communication therebetween.

In Step S34, the microcomputer 11 sets the "measurement disabled flag" described above in order to switch the measurement state into the measurement disabled state. Further, an initial value is stored in a buffer that holds the ground fault resistance value RL of the data to be transmitted. Then, the process proceeds to Step S37.

In Step S35, the microcomputer 11 identifies whether a predetermined "measurement restart event" occurs or not. Immediately after it is identified that the predetermined "measurement restart event" occurs, the process proceeds to Step S36. In the other timing, the process shown in FIG. 3 is ended.

In Step S36, the microcomputer 11 resets the "measurement disabled flag" described above in order to release the measurement disabled state and then the process proceeds to Step S37.

In Step S37, the microcomputer 11 substitutes an initial value to the "ground fault information ID". In the present embodiment, the initial value is set as "0".

Specific Example of Operation

Operation Example (1)

Figure 4:
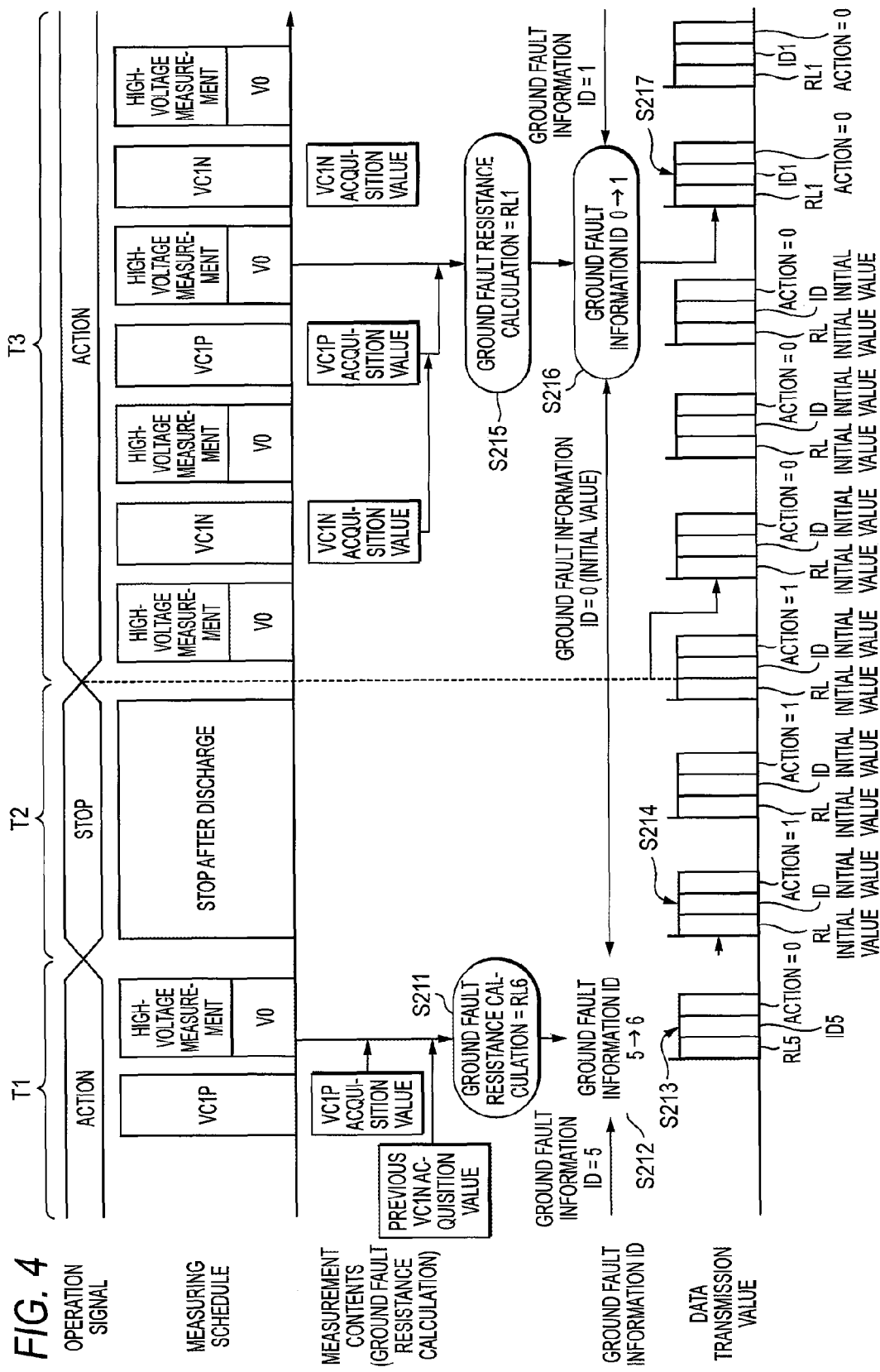
FIG. 4 is a time chart showing an operation example (1) of the insulated state detection device shown in FIG. 1.

FIG. 4 shows an operation example (1) of the insulated state detection device shown in FIG. 1.

In the operation example (1), it is assumed that an operation of the insulated state detection device 10 changes in accordance with the measurement disabled event detected in Step S33 of FIG. 3 and the measurement restart event detected in Step S35 of FIG. 3. In other words, switching from "ACTION" to "STOP" of operation signal shown in FIG. 4 represents the occurrence of the measurement disabled event and switching from "STOP" to "ACTION" of the operation signal represents the occurrence of the measurement restart event.

Since the measurement disabled event is not yet occurred at a time period T1 shown in FIG. 4, the measuring schedule is executed and the above-described voltage (V0, Vc1−, Vc1+) is measured. Here, "VC1P" and "VC1N" in FIG. 4 respectively correspond to the above-described voltage "Vc1+" and "Vc1−.

In Step S211 of FIG. 4, the microcomputer 11 calculates the latest ground fault resistance value (RL6: this is assumed as the sixth value), on the basis of the voltage (V0, Vc1−, Vc1+) measured immediately before (Step S18 in FIG. 2).

Further, upon reaching a predetermined timing before the occurrence of the measurement disabled event, the microcomputer 11 transmits the data of final measurement results to the host ECU 40 in the next Step S213. Before Steps S211, S212 are executed, the ground fault resistance value (RL5) measured in the fifth and the ground fault information ID (ID: 5) corresponding to the measurement timing of the ground fault resistance value (RL5) are transmitted. Further, as a part of the status information, "operation information Action=0" i.e., information representing a state (operation signal="ACTION" state) other than the measurement disabled state is also transmitted.

When the measurement disabled event occurs, the process of the measuring schedule is in a stop state after the detection capacitor C1 is discharged, as in a time period T2 shown in FIG. 4. Further, the microcomputer 11 resets the ground fault information ID and the ground fault resistance value as an initial value (Steps S33-S34-S37 in FIG. 3).

Upon reaching the timing of transmitting the data in the time period T2, the microcomputer 11 transmits the ground fault resistance value (initial value), the ground fault information ID and the status information in Step S214. Since contents of the ground fault information ID in this case are reset to an initial value by the occurrence of the measurement disabled event, the ground fault information ID is the initial value "0".

Further, since Step S20 in FIG. 2 is not executed while the measurement is disabled, the contents of the ground fault information ID in the time period T2 do not change but remains as an initial value. Further, since Step S18 in FIG. 2 is not executed while the measurement is disabled, the value of the ground fault resistance to be outputted does not change but remains as an initial value.

As the measurement restart event occurs and a transition from the time period T2 to a time period T3 is made, the process of the measuring schedule is started again, as shown in FIG. 4. Then, the microcomputer 11 calculates the latest ground fault resistance value (RL1) in Step S215 when the measured values of the voltage (V0, Vc1−, Vc1+) required for the calculation coincides with each oilier (Step S18 in FIG. 2).

Further, after the ground fault resistance value is calculated, the contents of the ground fault information ID are updated from "0" that is an initial value to "1" (Step S20). Upon reaching a predetermined timing after such an update, the microcomputer 11 transmits data in Step S217. The data includes the ground fault resistance value (RL1) calculated in the last, the present ground fault information ID (TD=1) and the status information.

Operation Example (2)

Figure 5:
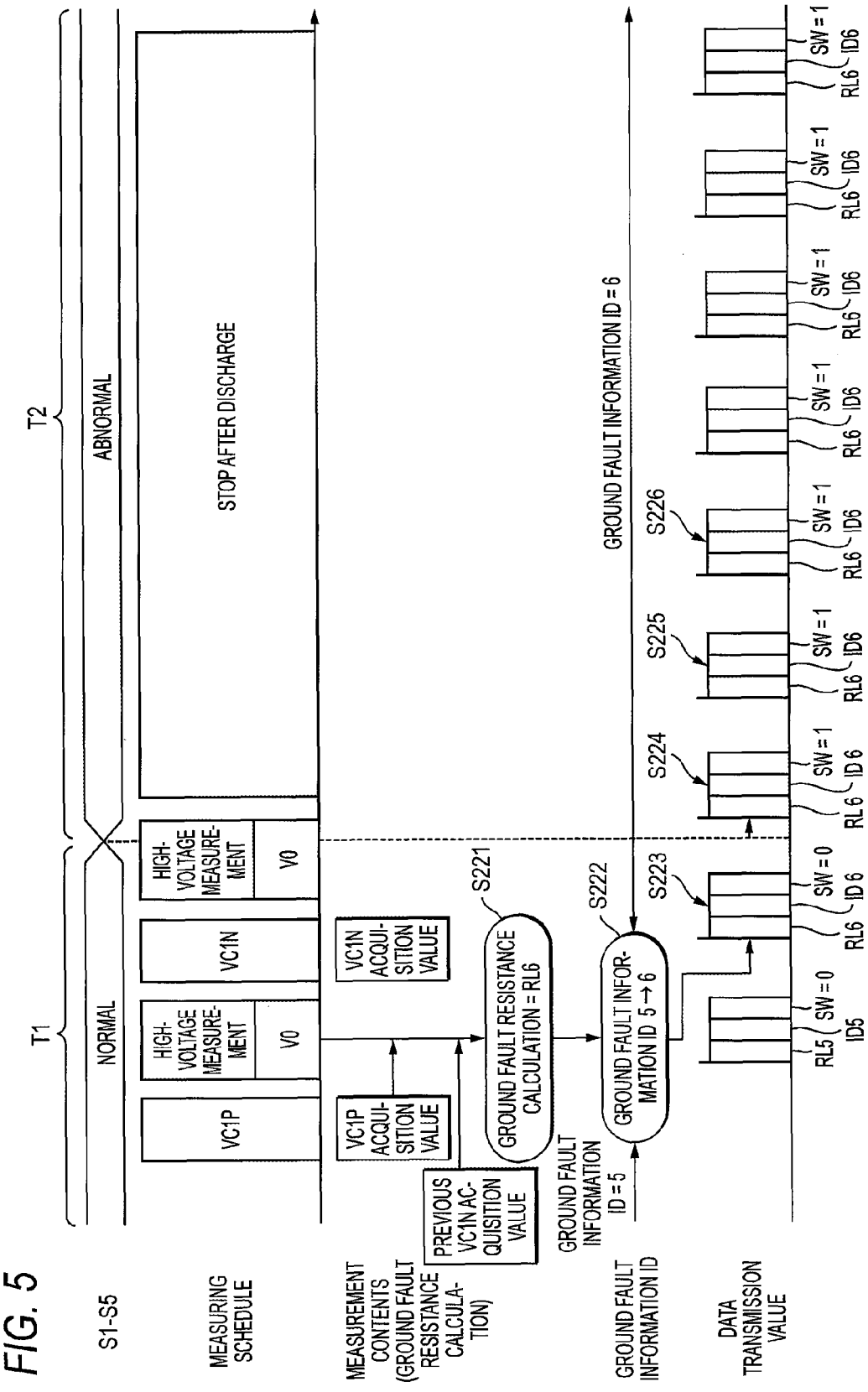
FIG. 5 is a time chart showing an operation example (2) of the insulated state detection device shown in FIG. 1.

FIG. 5 shows an operation example (2) of the insulated state detection device shown in FIG. 1.

In the operation example (2), it is assumed that a failure of the switching elements S1 to S5 or the like occurs in the insulated state detection device 10. Specifically, in the example shown in FIG. 5, the state of the switching elements S1 to S5 is normal during the time period T1, but the occurrence of a failure is detected in the time period T (Step S15 in FIG. 2).

As shown in FIG. 5, in the time period T1 in which a failure does not occur, the process of the measuring schedule is executed, the latest ground fault resistance value is calculated in Step S221 and the contents of the ground fault information ID are updated in Step S223. Further, in Step S223, data including the ground fault resistance value (RL6) and the ground fault information ID (ID=6) is transmitted.

Then, when the occurrence of a failure is detected, the process of the measuring schedule is stopped, as in the time period T2 of FIG. 5. Further, the calculation process of the ground fault resistance value is also stopped and the update of the ground fault information ID is also stopped. Here, the final data updated is transmitted by the microcomputer 11 each time a predetermined time has elapsed.

For example, in all of Steps S224, S225, S226 shown in FIG. 5, the sixth value RL6 calculated in Step S221 is transmitted as a ground fault resistance value and the same value (ID=6) is transmitted as a ground fault information ID. Further, as a part of the status information, a switch information (SW=1) representing a failure location is transmitted. The switch information (SW=1) represents that the switching elements S1 to S5 are abnormal and a switch information (SW=0) represents that the switching elements S1 to S5 are normal.

Specifically, since Step S12 is not executed after the measurement disabled flag is set in Step S16 shown in FIG. 2, the process of the measuring schedule is stopped. Further, since Step S18 shown in FIG. 2 is not executed, calculation of the ground fault resistance value is stopped. Furthermore, since Step S20 is not executed, the update of the ground fault information ID is stopped.

Operation Example (3)

Figure 6:
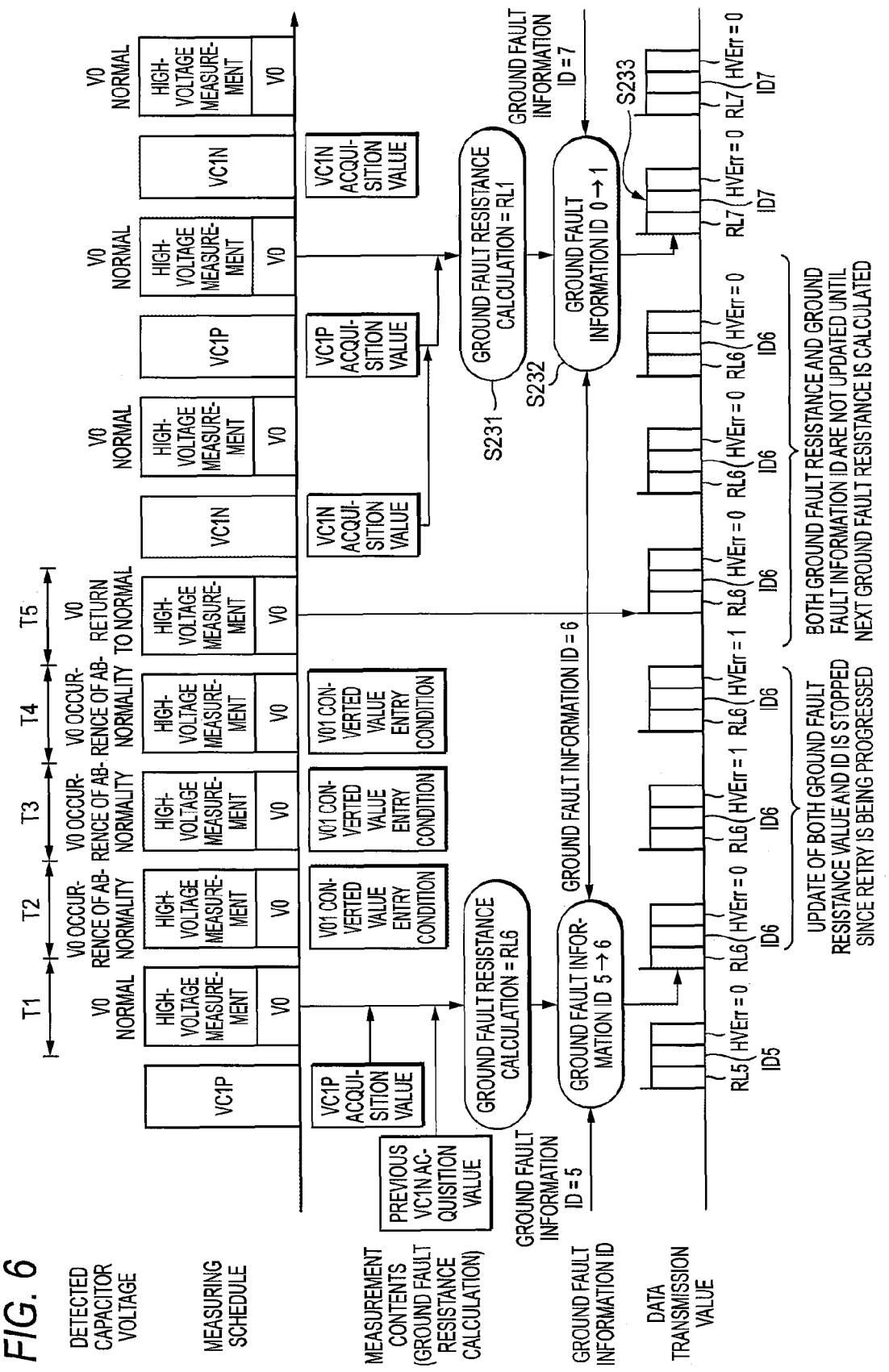
FIG. 6 is a time chart showing an operation example (3) of the insulated state detection device shown in FIG. 1.

FIG. 6 shows an operation example (3) of the insulated state detection device shown in FIG. 1.

In the operation example (3), it is assumed that execution of the process is temporarily on standby since a temporary abnormal state occurs. Specifically, it is assumed that abnormality occurs in the high voltage outputted from the in-vehicle DC high-voltage power supply 50.

In the example shown in FIG. 6, a normal voltage is detected when the voltage V0 of the detection capacitor C1 is measured in the time period T1, but an abnormal voltage is detected in the time period T2. When such voltage abnormality occurs, the process proceeds to Step S14 from Step S13 shown in FIG. 2 and is on standby.

In the example shown in FIG. 6, voltage abnormality is detected in each of time periods T2, T3, T4 and the voltage returns to the normal voltage in a time period T5. Accordingly, the measurement operation is on standby in the time periods T2, T3, T4 and resumes from the time period T5.

Further, when the measurement operation is on standby, as in the time periods T2, T3, T4, the calculation process of the resistance value is temporarily stopped and the update of the ground fault information ID is also stopped. Although transmission of data is executed each time a certain time of period has elapsed, the content of the data (the ground fault resistance value RL and the ground fault information ID) to be transmitted does not change during the standby state.

When the measured voltage V0 returns to the normal state, the measurement operation resumes and then the measured values required for calculation of the ground fault resistance value coincide with each other, the calculation process of the ground fault resistance value is executed again (Step S231). Further, after the calculation process of the ground fault resistance value is executed, the ground fault information ID is updated (Step S232). Then, upon reaching a data transmission timing, the ground fault resistance value (RL7) calculated in the last and the updated ground fault information ID (ID=7) are transmitted (Step S233).

Explanation for State Transition of Ground Fault Information ID

Figure 7:
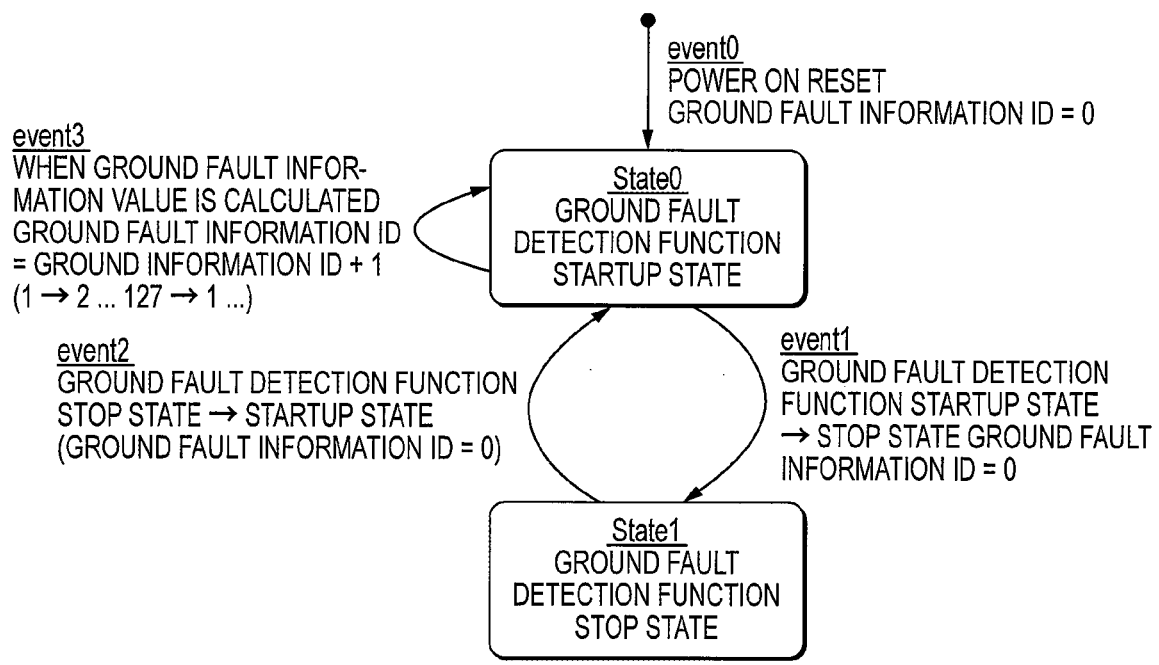
FIG. 7 is a state transition diagram showing a change in an operation state of the insulated state detection device shown in FIG. 1.

FIG. 7 shows a change in an operation state of the insulated state detection device shown in FIG. 1.

As shown in FIG. 7, when an event (event0) of Power On Reset occurs, the process proceeds to a startup state (State0) of a grounding detection function. At this time, the ground fault information ID is reset to an initial value (0) in accordance with the event (event0). Actually, when an ignition switch is turned on, Steps S31-S32-S37 shown in FIG. 3 are executed and therefore the ground fault information ID is reset.

Further, when an event (event1) of switching the grounding detection function from the startup state to a stop state occurs, the process proceeds to the stop state (State1) of the grounding detection function. Further, the ground fault information ID is reset to the initial value (0) in accordance with the event (event1). Actually, Steps S34 to S37 are executed and therefore the ground fault information ID is reset when the occurrence of a measurement disabled event is detected in Step S33 shown in FIG. 3.

Further, when an event (event2) of switching the grounding detection function from the stop state to the startup state occurs, the process returns to the startup state (State0) of the grounding detection function. Further, the ground fault information ID is reset to the initial value (0) in accordance with the event (event2). Actually, when the occurrence of a measurement restart event is detected in Step S35 shown in FIG. 3, Steps S36 and S37 are executed and therefore the ground fault information ID is reset.

Further, in the startup state (State0) of the grounding detection function, the value of the ground fault information ID is updated in a manner of 1, 2, 3, . . . , 127, 1, 2, . . . according to execution of the calculation process of the ground fault resistance.

Operation Example of Host ECU 40

Figure 9:
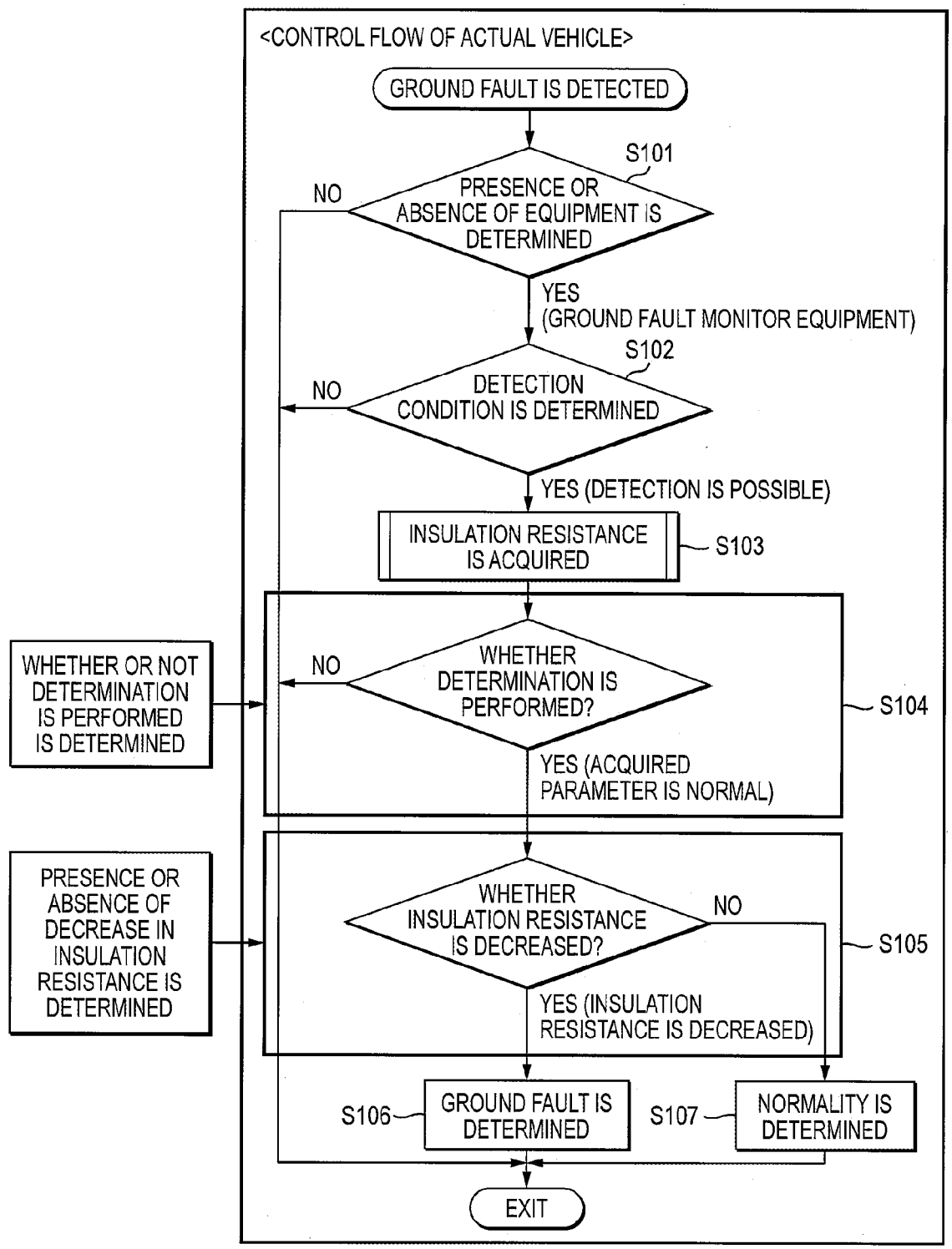
FIG. 9 is a flow chart showing an operation example of a host ECU 40 shown in FIG. 1.

FIG. 9 shows an operation example of the host ECU 40 shown in FIG. 1. Specifically, when the host ECU 40 executes a grounding detection process, the process shown in FIG. 9 is executed. An operation shown in FIG. 9 is described below.

In Step S101, the host ECU 40 identifies whether equipment for measuring the ground fault resistance is present or not. Specifically, as shown in FIG. 1, the insulated state detection device 10 is connected to the host ECU 40 and it is identified whether or nest data communication with the insulated state detection device 10 is allowable.

In Step S102, the host ECU 40 identifies whether or not the ground fault resistance can be detected, by referring to the status information transmitted from the insulated state detection device 10, for example. When it is determined that the ground fault resistance can be detected, the process proceeds to the next Step S103.

In Step S103, the host ECU 40 acquires information on the latest ground fault resistance value transmitted from the insulated state detection device 10 through data communication. At this time, the host ECU 40 can receive the value of the ground fault information ID described above and the status information, together with the ground fault resistance value.

In Step S104, the host ECU 40 obtains information of various parameters on the state of a vehicle that can be acquired on the vehicle and identifies whether or nest the situation is suitable for determination process of the ground fault resistance value. The parameter includes the ground fault information ID received from the insulated state detection device 10. For example, when it can be recognized from the value of the ground fault information ID that the time has elapsed from the calculation timing of the ground fault resistance value received by the host ECU 40, reliability of the ground fault resistance value is considered to be low and therefore the host ECU 40 may determine that the situation is not suitable for the determination process of the ground fault resistance value.

Here, synchronization between the value of the ground fault information ID representing the timing of the insulated state detection device 10 side and the timing of the host ECU 40 side can be made as follows, for example.

(1) The host ECU 40 grasps the timing corresponding to the value of the ground fault information ID, with reference to the timing where the ignition switch is turned on.

(2) The host ECU 40 applies a command or control signal (CON) for generating the events (event1, event2) shown in FIG. 7 to the insulated state detection device 10 and synchronization is made with reference to this timing.

(3) The host ECU 40 repeatedly receives data from the insulated state detection device 10 and grasps the timing by monitoring the changes in the value of the ground fault information ID received.

When it is recognized that the situation is suitable for the determination process of the ground fault resistance value, the host ECU 40 executes the determination on the ground fault resistance in the next Step S105. Specifically, it is identified whether or not the insulation resistance is decreased by comparing the ground fault resistance value received from the insulated state detection device 10 with a predetermined threshold.

When decrease in the insulation resistance is detected in Step S105, the host ECU 40 recognizes a ground fault state in Step S106 and outputs an alarm or displays the occurrence of abnormality, for example. When it is recognized in Step S105 that the decrease in the insulation resistance is not generated, the host ECU 40 considers the present situation as a normal state in Step S107 and displays information representing that the situation is normal.

Supplementary Explanation (1) The insulated state detection device 10 shown in FIG. 1 includes the positive-side input terminal (13) and the negative-side input terminal (14), which are respectively connected to the positive-side power line (111) and the negative-side power line (112) of the output of a predetermined high-voltage DC power supply (50), and the ground electrode (15). The insulated state detection device 10 is configured to grasp an insulated state between the ground electrode and the positive-side power line and between the ground electrode and the negative-side power line, on the basis of the charging voltage of the flying capacitor (C1). Further, as shown in FIG. 2, the insulated state detection device 10 includes a ground fault resistance value calculation unit (S18) adapted to calculate an insulation resistance value between the ground electrode and the positive-side power line and between the ground electrode and the negative-side power line, on the basis of measured values related to the charging voltage of the flying capacitor, measuring state identification units (S11, S13, S15) adapted to identify the presence or absence of abnormality on at least one measurement condition affecting the measured values, a timing information generation unit (S20) adapted to generate a timing information (ground fault information ID), to automatically update a value of the timing information by a predetermined value each time the ground fault resistance value calculation unit generates a new insulation resistance value and to reflect the identification state of the measuring state identification unit on the value of the timing information, and an information transmission unit (S22) adapted to transmit the insulation resistance value calculated by the ground fault resistance value calculation unit and the timing information generated by the timing information generation unit to a host control device.

(2) Further, as shown in FIG. 3 and FIG. 4, the measuring state identification unit initializes the value of the timing information generated by the timing information generation unit (S37) when a predetermined measurement disabled state is detected (S33) or when the measurement disabled state is released (S35). Further, as shown in FIG. 2, the ground fault resistance value calculation unit stops calculating a new insulation resistance value in the measurement disabled state.

(3) Further, as shown in FIG. 2 and FIG. 5, the measuring state identification unit stops updating the value of the timing information generated by the timing information generation unit and maintains the same value when a predetermined measuring abnormal state is detected, and the ground fault resistance value calculation unit stops calculating a new insulation resistance value in the measuring abnormal state.

(4) Further, as shown in FIG. 2 and FIG. 6, the measuring state identification unit stops updating the value of the timing information generated by the timing information generation unit when a temporary measuring abnormal state is detected and maintains the timing information at the same value until returning to a normal state, and the ground fault resistance value calculation unit stops calculating a new insulation resistance value until returning to a normal state after the temporary measuring abnormal state is detected.

(5) Further, as shown in FIG. 3, the measuring state identification unit initializes the value of the timing information generated by the timing information generation unit (S37) when a reset state by an ignition signal transmitted from a vehicle is detected.

(6) Further, as shown in FIG. 6, the information transmission unit transmits the information of the insulation resistance value calculated in the last together with the timing information each time a predetermined time elapses in a state where the ground fault resistance value calculation unit stops calculating a new insulation resistance value.

(7) Further, as shown in FIG. 2 and FIG. 6, the measuring state identification unit detects abnormality of power supply voltage applied to at least the positive-side power line or the negative-side power line, on the basis of the measured value of voltage of the flying capacitor in a predetermined condition (S13).

What is claimed is:

1. An insulated state detection device comprising:
a positive-side input terminal and a negative-side input terminal that are respectively connected to a positive-side power line and a negative-side power line of an output of a predetermined high-voltage DC power supply;
a ground electrode;
a ground fault resistance value calculation unit that calculates an insulation resistance value between the ground electrode and the positive-side power line and between the ground electrode and the negative-side power line based on measured values related to a charging voltage of a flying capacitor;
a measuring state identification unit that identifies presence or absence of abnormality on at least one measurement condition affecting the measured values;
a timing information generation unit that generates a timing information, automatically updates a value of the timing information by a predetermined value each time the ground fault resistance value calculation unit generates a new insulation resistance value, and reflects a state of the identification of the measuring state identification unit on the value of the timing information; and
an information transmission unit that transmits the insulation resistance value calculated by the ground fault resistance value calculation unit and the timing information generated by the timing information generation unit to a host control device.

2. The insulated state detection device according to claim 1, wherein the measuring state identification unit initializes the value of the timing information generated by the timing information generation unit when a predetermined measurement disabled state is detected or when the measurement disabled state is released, and
the ground fault resistance value calculation unit stops calculating a new insulation resistance value in the measurement disabled state.

3. The insulated state detection device according to claim 1, wherein the measuring state identification unit stops updating the value of the timing information generated by the timing information generation unit and maintains the same value when a predetermined measuring abnormal state is detected, and
the ground fault resistance value calculation unit stops calculating a new insulation resistance value in the measuring abnormal state.

4. The insulated state detection device according to claim 1, wherein the measuring state identification unit stops updating the value of the timing information generated by the timing information generation unit when a temporary measuring abnormal state is detected and maintains the timing information at the same value until returning to a normal state, and the ground fault resistance value calculation unit stops calculating a new insulation resistance value until returning to a normal state after the temporary measuring abnormal state is detected.

5. The insulated state detection device according to claim 1, wherein the measuring state identification unit initializes the value of the timing information generated by the timing information generation unit when a reset state caused by an ignition signal transmitted from a vehicle is detected.

6. The insulated state detection device according to claim 1, wherein the information transmission unit transmits the information of the insulation resistance value calculated in the last together with the timing information each time a predetermined time elapses in a state where the ground fault resistance value calculation unit stops calculating a new insulation resistance value.

7. The insulated state detection device according to claim 1, wherein the measuring state identification unit detects abnormality of power supply voltage applied to at least the positive-side power line or the negative-side power line, based on the measured value of voltage of the flying capacitor in a predetermined condition.

* * * * *